United States Patent
Gliese

(10) Patent No.: US 7,425,842 B2
(45) Date of Patent: Sep. 16, 2008

(54) LOGIC BASIC CELL

(75) Inventor: Jorg Gliese, Munich (DE)

(73) Assignee: Infineon Technologies AG (DE)

( * ) Notice: Subject to any disclaimer, the term of this patent is extended or adjusted under 35 U.S.C. 154(b) by 284 days.

(21) Appl. No.: 11/131,452

(22) Filed: May 16, 2005

(65) Prior Publication Data

US 2005/0285622 A1  Dec. 29, 2005

(30) Foreign Application Priority Data

May 25, 2004 (DE) .................. 10 2004 025 581

(51) Int. Cl.
*G06F 7/38* (2006.01)
*H03K 19/173* (2006.01)
*H03K 19/177* (2006.01)

(52) U.S. Cl. .............................. 326/38; 326/37; 326/39; 326/40; 326/41

(58) Field of Classification Search ............. 326/37–40, 326/47; 327/407–408
See application file for complete search history.

(56) References Cited

U.S. PATENT DOCUMENTS 6,331,789 B2  12/2001  Or-Bach
6,529,040 B1  3/2003  Carberry et al.
6,819,136 B2 *  11/2004  Or-Bach ...................... 326/41

FOREIGN PATENT DOCUMENTS

WO  WO 2004/075409  *  9/2004  ............... 326/38
WO  WO-2004/075409 A1  9/2004

OTHER PUBLICATIONS

Wannemacher, M; "Das FPGA-Kochbuch"; Chapter 6.4: SRAM-Zelle von XILINX, 1. Auflage, International Thomson Publishing Company, Bonn, Germany, 1998, p. 111.
Wannemacher, M; "Das FPGA-Kochbuch"; Chapter 7.36: Logikblock (CLB) der XC4000-Familien, 1. Auflage, International Thomson Publishing Company, Bonn, Germany, 1998, p. 197.

* cited by examiner

*Primary Examiner*—Rexford Barnie
*Assistant Examiner*—Matthew C Tabler
(74) *Attorney, Agent, or Firm*—Dickstein, Shapiro, LLP.

(57) ABSTRACT

A logic basic cell for processing a first and a second data signal, having a multiplex device for multiplexing the first and second data signals in a multiplex operating state, having a logic device for forming a logic combination of the first and second data signals in accordance with a selectable logic function in a logic function operating state, it being possible to provide, as an output signal, one of the first and second data signals during the multiplex operating state and the logic combination of the first and second data signals in accordance with the selected logic function during the logic function operating state. The logic basic cell contains a control unit, which predetermines, based on a control signal, the logic basic cell operates in the multiplex operating state or in the logic function operating state.

8 Claims, 5 Drawing Sheets

FIG 2

| s0p | s0n | s1p | s1n | s2p | s2n | s3p | s3n | s4 | y | $\bar{y}$ |
|---|---|---|---|---|---|---|---|---|---|---|
| 0 | 0 | 0 | 0 | 0 | 0 | 0 | 0 | 0 | 1 | 0 |
| 1 | 1 | 0 | 0 | 0 | 0 | 0 | 0 | 0 | $a_0 \vee \bar{a}_1$ | $\overline{a_0 \vee \bar{a}_1}$ |
| 0 | 0 | 1 | 1 | 0 | 0 | 0 | 0 | 0 | $a_0 \vee \bar{a}_1$ | $\overline{a_0 a_1}$ |
| 1 | 1 | 1 | 1 | 0 | 0 | 0 | 0 | 0 | $a_0$ | $\bar{a}_0$ |
| 0 | 0 | 0 | 0 | 1 | 1 | 0 | 0 | 0 | $\bar{a}_0 \vee a_1$ | $a_0 \bar{a}_1$ |
| 1 | 1 | 0 | 0 | 1 | 1 | 0 | 0 | 0 | $a_1$ | $\bar{a}_1$ |
| 0 | 0 | 1 | 1 | 1 | 1 | 0 | 0 | 0 | $\overline{a_0 \oplus a_1}$ | $a_0 \oplus a_1$ |
| 1 | 1 | 0 | 0 | 0 | 0 | 1 | 1 | 0 | $a_0 a_1$ | $\overline{a_0 a_1}$ |
| 0 | 0 | 1 | 1 | 0 | 0 | 1 | 1 | 0 | $\overline{a_0} a_1$ | $a_0 \bar{a}_1$ |
| 1 | 1 | 1 | 1 | 0 | 0 | 1 | 1 | 0 | $a_0 \oplus a_1$ | $\overline{a_0 \oplus a_1}$ |
| 0 | 0 | 0 | 0 | 1 | 1 | 1 | 1 | 0 | $\bar{a}_1$ | $a_1$ |
| 1 | 1 | 0 | 0 | 1 | 1 | 1 | 1 | 0 | $a_0 \bar{a}_1$ | $\overline{a_0 \bar{a}_1}$ |
| 0 | 0 | 1 | 1 | 1 | 1 | 1 | 1 | 0 | $\bar{a}_0$ | $a_0$ |
| 1 | 1 | 1 | 1 | 1 | 1 | 1 | 1 | 0 | $\overline{a_0 \vee a_1}$ | $a_0 \vee a_1$ |
| 0 | 1 | 1 | 0 | 1 | 0 | 0 | 1 | 1 | 0 | 1 |
|   |   |   |   |   |   |   |   |   | $\overline{ctrl} \cdot a_0 \vee ctrl \cdot a_1$ | $\overline{ctrl} \cdot \bar{a}_0 \vee ctrl \cdot \bar{a}_1$ |

LOGIC BASIC CELL

CROSS-REFERENCE TO RELATED APPLICATION

This application claims priority to German Patent Application Ser. No. 10 2004 025 581.4-42, which was filed on May 25, 2004.

FIELD OF THE INVENTION

The invention relates to a logic basic cell and a logic basic cell arrangement.

BACKGROUND OF THE INVENTION

The advent of digital technology and the rapid development of microprocessor technology gave rise to a demand for programmable logic. A PLD ("programmable logical device") is an integrated circuit whose logic function is defined by the user by means of programming. A PLD is an architecture for digital logic operations with a plurality of switches that enable a multiplicity of signal paths. The logic function assigned to a PLD in a user-specific fashion is defined by means of the configuration of the PLD.

PLDs include, inter alia, field-programmable gate arrays (FPGAs), the functionality of which can be assigned to them by the user, and mask-programmable gate arrays (MPGAs, also called "structured ASICs"), which can be allocated a logic function by means of hardware configuration. Via-programmable gate arrays (VPGAs) belong among MPGAs.

A digital logic cell maps n input signals onto an output signal. The number of possible mapping functions is $2^{2^n}$. A circuit group as a digital logic cell is realized in accordance with the prior art by using so-called look-up tables (LUT), for example. For this purpose, function values of the logic function are set by means of a data word of $2^n$ bits. In other words, the respectively selected logic function is coded into a data word. n input signals $a_0, a_1, \ldots, a_{n-1}$ are combined with one another in accordance with the selected logic function. Consequently, the logic input signals of the logic function $y=f(a_0, a_1, \ldots, a_{n-1})$ may be regarded as a binary address and converted into a one-hot coding in order to select the function value subsequently by means of pass gate logic. Such a method is disclosed in Wannemacher, M "Das FPGA Kochbuch", ["The FPGA Cookbook"], FIG. 6.4: SRAM cell from XILINX, 1st Edition, International Thomson Publishing Company, Bonn, 1998, p. 111, for example.

As an alternative, the inputs may serve as control inputs for a multiplexer tree, see Wannemacher, M "Das FPGA Kochbuch", ["The FPGA Cookbook"], FIG. 7.36: Logic block (CLB) of the XC4000 families, 1st Edition, International Thomson Publishing Company, Bonn, 1998, p. 197. The multiplexers may be realized in a logic-based manner and/or on the basis of transmission gates.

U.S. Pat. No. 6,529,040 B1 discloses an FPGA on the basis of a look-up table (LUT).

The logic basic cells using a look-up table which are disclosed in the prior art have disadvantages with regard to switching speed and/or interference immunity. The known solutions furthermore cannot be realized sufficiently compactly in terms of layout for many applications. Therefore, continued scaling is possible only with difficulty using the LUT solutions disclosed in the prior art.

As an alternative to the known LUT architectures, the prior art discloses interconnections comprising individual logic gates which can be used to form a desired logic function. However, such an architecture is restricted to the formation of a very specific logic function, whereas the overall scope of all possible logic mapping functions can only be realized in a very complicated manner using predetermined logic gates. The complicated logic gates are restricted with regard to the achievable switching speed, too. The limitation of the scope of the possible logic functions considerably complicates the automatic logic partitioning in the case of an FPGA design.

Another approach consists in making logic complex gates, which realize a combination of a plurality of logic inputs, flexibly interconnectable and in accomplishing a complete or almost complete coverage of the combinatorial function space through skillful combination of fewer than the possible inputs. However, such a realization has the disadvantage that flexibility outside the cell is used for the internal logic configuration of the cell and is thus limited. Moreover, the functional mapping is generally complicated.

U.S. Pat. No. 6,331,789 B discloses a logic array device with an array of programmable logic cells, having a plurality of inputs and a plurality of outputs and adapted connection structures which are superposed on a part of the programmable cell.

SUMMARY OF THE INVENTION

The invention is based on the problem, in particular, of providing a logic basic cell with an extended functionality with a tenable outlay.

The logic basic cell according to the invention for processing a first and a second data signal contains a multiplex device for multiplexing the two data signals (in particular with the aid of a third signal) in a multiplex operating state, and a logic device for forming a logic combination of the two data signals in accordance with a selectable logic function in a logic function operating state, it being possible to provide, as output signal, one of the two data signals in the multiplex operating state and the logic combination of the two data signals in accordance with the selected logic function in the logic function operating state. It is possible to provide to a control unit a control signal by means of which it is possible to predetermine whether the logic basic cell is operated in the multiplex operating state or in the logic function operating state.

The logic basic cell arrangement according to the invention contains a first logic function block having two data signal inputs, to which a first input signal and a second input signal can be applied, and having a data signal output for providing a logic combination of the first input signal and the second input signal in accordance with a predetermined first logic subfunction. Furthermore, the logic basic cell arrangement contains a second logic function block having two data signal inputs, to which a third (e.g. the first) input signal and a fourth (e.g. the second) input signal can be applied, and having a data signal output for providing a logic combination of the third input signal and the fourth input signal in accordance with a predeterminable second logic subfunction. Furthermore, the logic basic cell arrangement contains a logic basic cell having the features described above, to which the output signal of the first logic function block can be provided as first data signal, to which the output signal of the second logic function block can be provided as second data signal and to which a third data signal can be provided as control signal.

BRIEF DESCRIPTION OF THE DRAWINGS

Exemplary embodiments of the invention are illustrated in the figures and are explained in more detail below.

In the figures:

FIG. 2 shows a table showing the output signals provided depending on the signals applied to the logic basic cell from FIG. 1.

Identical or similar components in different figures are provided with identical reference numerals.

Figure 1:
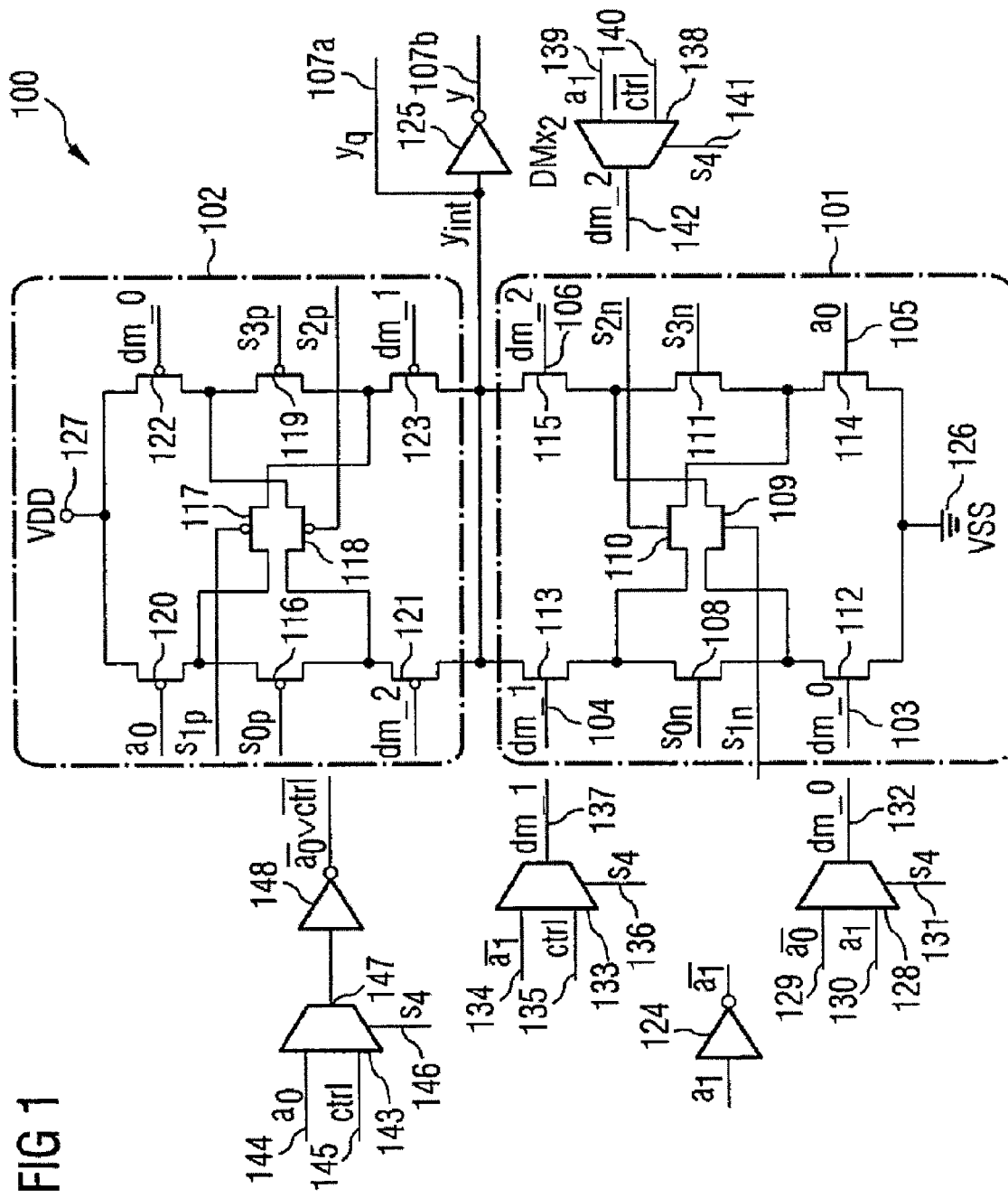
FIG. 1 shows a logic basic cell in accordance with a first exemplary embodiment of the invention.

The illustrations in the figures are schematic and not to scale.

DETAILED DESCRIPTION OF PREFERRED EMBODIMENTS OF THE INVENTION

One basic idea of the invention can be seen in the fact that a logic basic cell is provided which is set up both for logically combining two data signals and for multiplexing the data signals. To put it another way, the logic basic cell can carry out a predetermined logic operation (preferably any of $2^{2^n}$ possible logic functions) or can be operated as a multiplexer. The logic basic cell of the invention can thus in particular either realize all $2^{2^n}$ logic functions of two data signals or will be operated as a controlled 2:1 multiplexer.

Consequently, the invention provides a general logic circuit which is suitable in particular for use in regular cell arrays (FPGA, MPGA), the circuit, with a preferably very small or minimal number of transistors, preferably being intended to achieve a complete coverage of the combinatorial function space of its n inputs. In particular, the invention makes it possible to realize any individual one of sixteen possible logic combinations of two inputs, the logic basic cell being able to be used as a controlled 2:1 multiplexer in another operating state.

Consequently, a logic basic cell is provided which has an additional multiplexer functionality over and above the provision of the complete function space. The flexibility when operating the logic basic cell according to the invention is thereby increased.

By means of applying a control signal to a control unit, it is possible to select or switch between a logic function operating state and a multiplex operating state, a predefinable logic combination of two data signals being realized in the logic function operating state, whereas one of the two data signals is provided at an output in the multiplex operating state.

An optimum realization of a logic function of two inputs $y=f(a_1, a_0)$ with the two data signals $a_1, a_0$ can be realized according to the invention using four transistors for switching $\bar{a}_1, a_1 \bar{a}_0, a_0$, whereas four transistor switches can be used for the construction of the four possible product terms. In standard CMOS technology, logic gates are composed of a pull-up path and a pull-down path. The eight transistors mentioned above can be used for each of these two paths, so that sixteen transistors are required for an advantageous realization of all functions of two inputs in CMOS technology if the configuration switches are designed as transistors.

According to the invention, a multiplexer functionality is integrated as an additional feature into such a logic basic cell having logic functionality for forming a logic combination of the two data signals. By way of example, a third data signal provided at the logic basic cell can be inverted by means of an inverter, so that it is available in both binary polarities and can then be used in the context of the multiplexer functionality. The four configuration switches can be set in such a way that the series paths in the p- and n-channel transistors are switched on and the cross-connections between the series paths are switched off. Clearly, this gives rise to a sequence of two CMOS structures that can be used as a three-state multiplexer by the transistors coupled to the output being connected to the signal inputs in such a way that only one C2MOS structure in each case can occupy the output. The two data inputs can be applied the gate terminals of the transistors coupled to the supply potentials, so that each C2MOS structure switches a data input. As a result, the multiplexer is realized between the two data signal inputs, and it is possible to effect multiplexing between $a_0$ and $a_1$.

At those locations of the logic basic cell at which conflicts may occur between the allocation of the transistor gates when the cell is utilized as a universal logic device or a multiplexer, it is possible to provide multiplexers which distinguish between the two function modes (combinatorics of two inputs and 2:1 multiplexer) by means of an additional switch.

The logic basic cell arrangement according to the invention clearly makes use of a logic basic cell having a multiplexer functionality in order to process logic output signals of two logic function blocks. If the logic basic cell according to the invention of the logic basic cell arrangement is operated in the multiplex operating state, then the so-called Shannon decomposition can be realized with realization of a logic subfunction of two data signals by the two logic function blocks with the logic basic cell arrangement:

$$y(a_2, a_1, a_0) = \bar{a}_2 \cdot y_0(a_1, a_0) \lor a_2 y_1(a_1, a_0) \quad (1)$$

In accordance with the Shannon decomposition formulated in equation (1) a logic function $y(a_0, a_1, a_2)$ of three input signals $a_0, a_1, a_2$ can be decomposed into two logic subfunctions $y_0(a_1, a_0)$ and $y_1(a_1, a_0)$ realized by the logic function blocks. The formation of the function y from $y_0$ and $y_1$ is effected using the third input signal $a_2$ provided to the logic basic cell according to the invention in the multiplex operating state.

However, if the logic basic cell in the logic basic cell arrangement is operated in the logic function operating state, then a more complex function may also be realized with a disjoint decomposition by means of the logic basic cell arrangement:

$$f(a_n, a_{n-1}, \ldots, a_0) = f_0(f_1(Q_1), f_2(Q_2)) \quad (2)$$

where $$Q_1 \cup Q_2 = \{a_n, a_{n-1}, \ldots, a_0\} \char`\^ Q_1 \cap Q_2 = 0 \quad (3)$$

Consequently, the logic basic cell arrangement according to the invention significantly increases the functional flexibility or the diversity of processable logic functions in comparison with the prior art.

The logic basic cell according to the invention may have four data signal inputs, to which the two data signals and the logically complementary data signals thereof can be applied. Furthermore, a first logic selection element may be provided between a first data signal input and a second data signal input, a second logic selection element may be provided between the first data signal input and a fourth data signal input, a third logic selection element may be provided between the second data signal input and a third data signal input, and a fourth logic selection element may be provided between the third data signal input and the fourth data signal input.

The logic function which is realized by the logic basic cell according to the invention in accordance with the configuration described may be predetermined by means of the first to fourth logic selection elements. The logic function (for example ORing, ANDing, etc.) thus set then defines the logic function by means of which the data signals at the data signal inputs are logically combined with one another.

In accordance with this configuration, a logic basic cell is provided, in particular for use in regular cell arrays (FPGA, MPGA), in a circuitry realization such that a complete mapping of the combinatorial function space is achieved in conjunction with a very small number of required components (for example transistors as logic selection elements). In other words, the logic basic cell according to the invention in accordance with the development described makes it possible to realize any possible logic combination of two data signals in an optimized interconnection of logic selection elements and data signal inputs.

Clearly, a first data signal, a complementary data signal with respect to the first data signal, a second data signal and a complementary data signal with respect to the second data signal are applied to the four data signal inputs. The logic selection elements are configured in such a way that they determine the logic function realized by the logic basic cell according to the invention. This may be achieved for example by means of a hardwired realization of the logic selection elements, so that, in this case, the logic function is determined by means of the invariable wiring of the data signal inputs that is predetermined by the logic selection elements. As an alternative, the logic selection elements may be provided for example as logic selection transistors, the logic function to be realized being predetermined by means of applying logic selection signals to the gate terminals of said logic selection transistors.

The architecture of the logic basic cell in accordance with the configuration described is very simple, thus enabling any possible logic function to be realized with a very low circuitry outlay. This results in a very compact realization of the logic basic cell, chip area is saved, and continued miniaturization is made possible.

On account of the miniaturizability of the logic basic cell of the invention, in the case of which only very few circuitry components have to be used, the signal paths are kept short, an energy-saving operability is made possible and a high processing speed is achieved in conjunction with high flexibility with regard to the logic functions to be realized.

The logic selection elements may be invariable hardware elements. In accordance with this realization, the desired logic function is fixedly predetermined once, to be precise by means of wiring the four data signals in a predetermined manner. The coupling between the individual data signals that are provided at the data signal inputs is predetermined by the interconnection of the logic selection elements and thus leads to an unambiguous logic function.

In accordance with the configuration described, the logic selection elements may be realized by means of a plurality of metallization planes and/or vias.

In the case of the logic basic cell according to the invention, the first logic selection element may be a first logic transistor, which can be controlled by means of a first logic selection signal. The second logic selection element may be a second logic transistor, which can be controlled by means of a second logic selection signal. The third logic selection element may be a third logic transistor which can be controlled by means of a third logic selection signal, and the fourth logic selection element may be a fourth logic transistor, which can be controlled by means of a fourth logic selection signal.

In accordance with this configuration, four logic selection signals are applied to the logic transistors, preferably to the gate terminals thereof, thereby realizing a very specific coupling of the data signals at the data signal inputs. The logic function that is realized is predetermined in accordance with this specific coupling, which can be predetermined in a variable manner.

Furthermore, the logic basic cell according to the invention may have four data signal transistors, at the gate terminals of which in each case one of the data signals or a logically complementary data signal with respect to one of the data signals can be provided.

In the case of this configuration, the four data signals, i.e. the first data signal and its logic complement and also the second data signal and its logic complement, are coupled into the logic basic cell according to the invention via gate terminals of four data signal transistors.

In accordance with the configuration described, a first data signal transistor may be connected up in such a way that its first source/drain terminal is coupled to a first source/drain terminal of the first logic transistor and to a first source/drain terminal of the second logic transistor. A second source/drain terminal of the first data signal transistor may be coupled to a first source/drain terminal of a third data signal transistor.

The third data signal transistor may be connected up in such a way that its second source/drain terminal is coupled to a first source/drain terminal of the fourth logic transistor and to a first source/drain terminal of the third logic transistor.

Furthermore, a second data signal transistor may be connected up in such a way that its first source/drain terminal is coupled to a second source/drain terminal of the first logic transistor and to a second source/drain terminal of the third logic transistor. A second source/drain terminal of the second data signal transistor may be coupled to a first source/drain terminal of a fourth data signal transistor.

Moreover, the fourth data signal transistor may be connected up in such a way that its second source/drain terminal is coupled to a second source/drain terminal of the second logic transistor and to a second source/drain terminal of the fourth logic transistor.

The described interconnection of the four data signal transistors with the four logic transistors provides a preferred circuitry realization of a logic basic cell for realizing all possible logic functions for combination of the data signals, and this with a very low circuitry outlay.

The logic basic cell according to the invention may have an evaluation switch coupled to the data signal output and a precharge switch, which switches are connected up and can be controlled in such a way that the output signal is provided at an output of the logic basic cell when the evaluation switch is open (i.e. permits signal transfer) and the precharge switch is closed (i.e. does not permit signal transfer), and that a reference signal is provided at the output of the logic basic cell when the precharge switch is open and the evaluation switch is closed. The evaluation switch and the precharge switch may in each case be transistors, in particular field effect transistors or bipolar transistors.

In accordance with this configuration, the output can be charged to the reference potential by means of the precharge switch (precharge phase), for example during the first half of a switching period of the logic basic cell. By means of the evaluation switch, the output signal processed in accordance with the predetermined logic function can be provided at the output, for example during the second half of the switching period of the logic basic cell (evaluate phase).

Each of the logic transistors and each of the data signal transistors of the logic basic cell may be a transistor of a first conduction type, the transistors of the first conduction type forming a first data signal path. Furthermore, the logic basic cell may have a second data signal path comprising transistors of a second conduction type, which is complementary to the first conduction type, in which case, for each of the transistors of the first data signal path, a correspondingly connected up transistor is provided in the second data signal path.

The two data signal paths are preferably symmetrical with respect to one another, the logic function or the multiplexer function being realized using transistors of a first conduction type (p conduction type or n conduction type) in the first data signal path and using transistors of a second conduction type (p conduction type or n conduction type) in the second data signal path.

The first conduction type may be the p conduction type and the second conduction type may be the n conduction type. As an alternative, the first conduction type may be the n conduction type and the second conduction type may be the p conduction type.

Consequently, the logic basic cell according to the invention may be set up as a CMOS logic basic cell.

The first data signal may be applied to the first data signal input.

Furthermore, the logic basic cell may have a first multiplex element, which has a first signal input, to which the second data signal can be applied. The first multiplex element may furthermore have a second signal input, to which a third data signal can be applied. Furthermore, the first multiplex element may have a control input, to which the control signal can be applied. The first multiplex element may have a data output, which is coupled to the second data signal input.

Furthermore, a second multiplex element may be provided, which has a first signal input, to which the complementary signal with respect to the first data signal can be applied, may have a second signal input, to which the second data signal can be applied, may have a control input, to which the control signal can be applied, and may have a data output, which is coupled to the third data signal input.

Moreover, the logic basic cell may have a third multiplex element, which has a first signal input, to which the complementary signal with respect to the second data signal can be applied, which has a second signal input, to which the complementary signal with respect to the third data signal can be applied, which has a control input, to which the control signal can be applied, and which has a data output, which is coupled to the fourth data signal input.

Furthermore, a fourth multiplex element may be provided, which has a first signal input, to which the first data signal can be applied, which has a second signal input, to which the complementary signal with respect to the third data signal can be applied, which has a control input, to which the control signal can be applied, and which has a data output, which is coupled to a first inverter.

The configurations described with the first to fourth multiplex elements make it possible, in a particularly advantageous manner, to integrate the multiplex functionality into the logic basic cell.

Furthermore, a second inverter for forming a logically complementary second data signal with respect to the second data signal may be provided.

The logic basic cell may have a third inverter, by means of which a complementary signal with respect to the output signal can be provided.

The logic basic cell according to the invention may be provided as an application-specific integrated circuit. In particular, the logic basic cell may be provided as programmable logic device (PLD), as field-programmable gate array (FPGA) or as mask-programmed application-specific integrated circuit.

At least one of the multiplex elements may be an invariable hardware element. In particular, at least one of the multiplex elements may be realized by means of a plurality of metallization planes and/or by means of vias. In accordance with these configurations in which the multiplexers are predetermined by a fixed invariable hardware structure, these multiplexers may be formed without additional transistors, which leads to a high degree of miniaturization of the logic basic cell.

The configurations that have been described for the logic basic cell also apply to the logic basic cell arrangement according to the invention.

A description is given below, with reference to FIG. 1, of a logic basic cell 100 in accordance with a first exemplary embodiment of the invention.

The logic basic cell 100 has a first data signal path 101 comprising n-MOS transistors and a second data signal path 102 comprising p-MOS transistors.

The structure of the first data signal path 101 is described in more detail below.

The first data signal path 101 has a first data signal input 103, at which a first data signal dm_0 is provided. Furthermore, a second data signal dm_1 is provided at a second data signal input 104. A third input signal namely a first data signal $a_0$, is provided at a third data signal input 105. Moreover, a fourth input signal dm_2 is provided at a fourth data signal input 106.

The output signal $y_q$ of the logic combination of the input signals dm_0, dm_1, $a_0$, dm_2 in accordance with a selected logic function is provided at a first data signal output 107a. This output signal is converted into its logically complementary value by means of a second inverter 125, said logically complementary value being provided as output signal y at a second data signal output 107b.

A first n-MOS logic selection transistor 108 is provided as a first logic selection element between the first data signal input 103 and the second data signal input 104. The first n-MOS logic selection transistor 108 can be controlled by means of a first logic selection signal $s_{0n}$. Furthermore, a second n-MOS logic selection transistor 109 is provided as a second logic selection element between the first data signal input 103 and the fourth data signal input 106. The second n-MOS logic selection transistor 109 can be controlled by means of a second logic selection signal $s_{1n}$. Moreover, a third n-MOS logic selection transistor 110 is provided as third logic selection element between the second data signal input 104 and the third data signal input 105, which third logic selection transistor 110 can be controlled by means of a third logic selection signal $s_{2n}$. A fourth n-MOS logic selection transistor 111 is connected up as a fourth logic selection element between the third data signal input 105 and the fourth data signal input 106, which fourth n-MOS logic selection transistor 111 can be controlled by means of a fourth logic selection signal $s_{3n}$.

The first data signal input 103 is coupled to the gate region of a first n-MOS data signal transistor 112. The second data signal input 104 is coupled to the gate region of a second n-MOS data signal transistor 113. The third data signal input 105 is coupled to the gate region of a third n-MOS data signal transistor 114. The fourth data signal input 106 is coupled to the gate region of a fourth n-MOS data signal transistor 115.

The first n-MOS data signal transistor 112 is connected up in such a way that its first source/drain terminal is coupled to a first source/drain terminal of the first p-MOS logic selection transistor 108 and to a first source/drain terminal of the second p-MOS logic selection transistor 109. A second source/drain terminal of the first p-MOS data signal transistor 112 is coupled to a first source/drain terminal of the third p-MOS data signal transistor 114, and is brought to the electrical ground potential 126. The third p-MOS data signal transistor 114 is connected up in such a way that its second source/drain terminal is coupled to a first source/drain terminal of the fourth p-MOS logic selection transistor 111 and to a first source/drain terminal of the third p-MOS logic selection transistor 110. The second p-MOS data signal transistor 113 is connected up in such a way that its first source/drain terminal is coupled to a second source/drain terminal of the first p-MOS logic selection transistor 108 and to a second source/drain terminal of the third p-MOS logic selection transistor 110. A second source/drain terminal of the second p-MOS data signal transistor 113 is coupled to a first source/drain terminal of the fourth p-MOS data signal transistor 115. The fourth p-MOS data signal transistor 115 is connected up in such a way that its second source/drain terminal is coupled to a second source/drain terminal of the second p-MOS logic selection transistor 109 and to a second source/drain terminal of the fourth p-MOS logic selection transistor 111.

The second source/drain terminal of the second p-MOS data signal transistor 113 and the first source/drain terminal of the fourth p-MOS data signal transistor 115 are coupled to the first data signal output 107.

The complementary data signal $\bar{a}_1$ with respect to the data signal $a_1$ can be generated from said data signal $a_1$ by means of a first inverter 124.

Furthermore, the logic basic cell 100 contains a first multiplex element 128, which has a first signal input 129, to which the complementary signal $\bar{a}_0$ with respect to the first data signal $a_0$ can be applied, which has a second signal input 130, to which the second data signal $a_1$ can be applied, which has a control input 131, to which the control signal $s_4$ can be applied, and which has a data output 132, at which the first input signal dm_0 is provided, and which is coupled to the first data signal input 103.

Furthermore, a second multiplexer 133 is provided, which has a first signal input 134, to which the complementary signal $\bar{a}_1$ with respect to the second data signal a.sub.1 can be applied, which has a second signal input 135, to which the control signal ctrl with respect to a third data signal $\overline{ctrl}$ can be applied, which has a control input 136, to which the control signal s.sub.4 can be applied, and which has a data output 137, at which the second input signal $dm_{13}$ 1 is provided, and which is coupled to the second data signal input 104.

Moreover, the logic basic cell 100 contains a third multiplexer 138, which has a first signal input 139, to which the second data signal a, can be applied, which has a second signal input 140, to which the third data signal $\overline{ctrl}$ can be applied, which has a control input 141, to which the control signal $s_4$ can be applied, which has a data output 142, at which the third input signal dm_2 is provided, and which is coupled to the fourth data signal input 106.

The logic basic cell 100 furthermore contains a fourth multiplexer 143, which has a first signal input 144, to which the first data signal $a_0$ can be applied, which has a second signal input 145, to which the complementary signal ctrl with respect to the third data signal $\overline{ctrl}$ can be applied, which has a input 146, to which the control signal $s_4$ can be applied, and which has a data output 147, which is coupled to a third inverter 148. The logic combination $\bar{a}_0 \vee$ ctrl is provided at an output of the inverter 148.

The construction of the second data signal path 102 is described below.

This path is connected up symmetrically with respect to the first data signal path 101. Instead of a first p-MOS logic selection transistor 108, a first p-MOS logic selection transistor 116 is provided in the second data signal path 102, which transistor 116 can be controlled by means of a first logic selection signal $s_{0p}$. The second n-MOS logic selection transistor 109 is replaced by a second p-MOS logic selection transistor 117, which can be controlled by means of a second logic selection signal $s_{1p}$. The third n-MOS logic selection transistor 110 is replaced by a third p-MOS logic selection transistor 118, which can be controlled by means of a third logic selection signal $s_{2p}$. The fourth n-MOS logic selection transistor 111 is replaced by a fourth p-MOS logic selection transistor 119, which can be controlled by means of a fourth logic selection signal $s_{3p}$.

The first n-MOS data signal transistor 112 is replaced by a first p-MOS data signal transistor 120. The second n-MOS data signal transistor 113 is replaced by a second p-MOS data signal transistor 121. The third n-MOS data signal transistor 114 is replaced by a third p-MOS data signal transistor 122. The fourth n-MOS data signal transistor 115 is replaced by a fourth p-MOS data signal transistor 123. The first data signal $a_0$ is provided at the gate terminal of the first p-MOS data signal transistor 120. The third input signal dm_2 is provided at the gate terminal of the second p-MOS data signal transistor 121. The first input signal dm_0 is provided at the gate terminal of the third p-MOS data signal transistor 122. The second input signal dm_1 is provided at the gate terminal of the fourth p-MOS data signal transistor 123.

It should be noted that other logic selection signals are provided in the second data signal path 102 compared with the first data signal path 101 (namely $s_{0p}$ to $s_{3p}$ in comparison with $s_{0n}$ to $s_{3n}$).

The source/drain terminals—coupled to one another—of the first p-MOS data signal transistor 120 and of the third p-MOS data signal transistor 122 are brought to the supply potential 127. Furthermore, the source/drain terminals—coupled to one another—of the second p-MOS data signal transistor 121 and of the fourth p-MOS data signal transistor 123 are coupled to the data signal output 107a.

The functionality of the logic basic cell 100 is described below. The logic basic cell 100 clearly constitutes a realization of a logic cell for forming all logic combinations of two data inputs $a_0$, $a_1$ with an integrated 2:1 multiplexer using static standard CMOS circuitry.

The logic basic cell 100 constitutes a realization of an optimized logic basic cell of two input signals $a_0$, $a_1$ (and of the logically complementary signals $\bar{a}_0$, $\bar{a}_1$ thereof) using static standard CMOS circuitry. By means of prescribing the first to fourth logic selection signals $s_{0n}$-$s_{3n}$ of the first data signal part 101 and the first to fourth logic selection signals $s_{0p}$-$s_{3p}$ of the second data signal part 102, it is defined whether the channel regions of the logic selection transistors 108 to 111 and 116 to 119, respectively, are conducting or nonconducting. As a result, specific signal paths within the data signal paths 101 and 102 are permitted, and others are precluded. This leads to a defined combination of the input signals $\bar{a}_1, a_1, \bar{a}_0, a_0$ in accordance with a logic function, which is predetermined by means of prescribing the logic selection signals $s_{0n}$ to $s_{3n}$, $s_{0p}$ to $s_{3p}$. The combination of the data signals in accordance with the predetermined logic function leads to output signals y and $y_q$ that are provided at the data signal outputs 107a, 107b.

The described functionality of the logic basic cell 100 represents the operation of the logic basic cell in a logic operating state, which can be set by means of prescribing the control signal $s_4$ with a logic value "0".

By contrast, in an operating state in which the control signal $s_4$ has a logic value "1", a multiplex operating state is set, in which the logic basic cell 100 serves as a multiplexer for outputting the first data signal $a_0$ or the second data signal $a_1$.

In both operating modes (logic function operating state and multiplex operating state) of the logic basic cell 100, the data input $a_0$ remains applied to the same terminal 105, 120; the allocation of the remaining three gate terminals of the data signal transistors 112, 113, 115 and 121 to 123 in the pull-up path and in the pull-down path from FIG. 1 is decided with the aid of the structural multiplexers 128, 133, 138. The allocation of the inputs is selected correspondingly with the switch $s_4$. The four switches $s_{0n}$ to $s_{3n}$ and $s_{0p}$ to $s_{3p}$ are switched such that eight configuration signals predetermine a desired logic function. This has the effect that, in multiplex operation, the paths in the p-type zone and in the n-type zone can be simultaneously switched on or off. The same switch $s_4$ also controls the input multiplexer 143, which feeds to the third inverter 148 either the data signal $a_0$ or the signal ctrl of the multiplexer function. The second inverter 125 at the second data signal output 107b makes it possible, in particular, to be able to use the multiplexer function (optionally or simultaneously) in inverting fashion and in noninverting fashion.

The table 200 shown in FIG. 2 specifies which logic function y (or $\bar{y}$ as logically complementary signal with respect thereto) is predetermined for the various permutations of the logic selection signals $s_{0n}$ to $s_{3n}$ and $s_{0p}$ to $s_{3p}$. Table 200 shows the allocation of the switching variables $s_{0p}$ to $s_{3p}$ and $s_{0n}$ to $s_{3n}$ with the aid of which all possible 16 logic functions for combination of the data signals $a_0$ and $a_1$ can be set. In this logic function operating state, in which the control signal $s_4$ has a logic value "0" (see all rows apart from the last row in FIG. 2), the logic basic cell 100 functions in logic operation. If, by contrast, the control signal $s_4$ is at a logic value "1" (see last row of the table in FIG. 2), then the logic basic cell 100 is in the multiplex operating state, so that either the first data signal $a_0$ or the second data signal $a_1$ is provided at an output y.

A description is given below, with reference to FIG. 3, of a logic basic cell arrangement 300 in accordance with an exemplary embodiment of the invention.

The logic basic cell arrangement 300 contains a first logic function block 301 having a first data signal input 304 and having a second data signal input 305, a first data signal $a_0$ being present at the first data signal input 304 and a second data signal $a_1$ being present at the second data signal input 305. The first logic function block 301 furthermore contains a data signal output 311, at which the result of a logic combination $f_0(a_1, a_0)$ in accordance with a predeterminable first logic subfunction is provided.

Furthermore, the logic basic cell arrangement 300 contains a second logic function block 302 having a first data signal input 306 and having a second data signal input 307. A fourth data signal $a_3$ is provided at the first data signal input 306. A fifth data signal $a_4$ is provided at the second data signal input 307. A logic combination $f_1(a_3, a_4)$ of the fourth input signal $a_3$ and of the fifth input signal $a_4$ in accordance with a predeterminable second logic subfunction $f_1$ is provided at a data signal output 312 of the second logic function block 302.

Furthermore, a logic basic cell 303 according to the invention is provided (for example the logic basic cell 100 shown in FIG. 1), to which the output signal of the first logic function block 301 is provided as first data signal at a first signal input 308, to which the output signal of the second logic function block 302 is provided as a second data signal at a second signal input 309, and to which a third data signal $a_2$ is provided as control signal.

Each of the logic function blocks 301, 302 may have an approximately arbitrary structure provided that it fulfils the functionality that it realizes a predeterminable logic combination $f_0$ or $f_1$ from the data signals $a_0, a_1$ or $a_3, a_4$ provided at its inputs. By way of example, a logic function block may be realized as a look-up table or like the logic basic cell 100 of the invention that is shown in FIG. 1 and is operated in the logic function operating state.

The logic basic cell 303 may serve for multiplexing the signals provided to it at the signal inputs 308, 309 using the multiplex device integrated in it and the signal $a_2$ or may effect a predeterminable logic combination of the signals provided to it at the signal inputs 308, 309 using the logic device. Depending on the operating state of the logic basic cell 303, either the signal $y_I = f(a_2, a_1, a_0)$ or a logic combination $y_{II} = f_2(f_0(a_1, a_0), f_1(a_4, a_3))$ of the outputs of the function blocks $f_0, f_1$ provided at the signal inputs 308, 309 is thus provided at the signal output 310.

Figure 3:
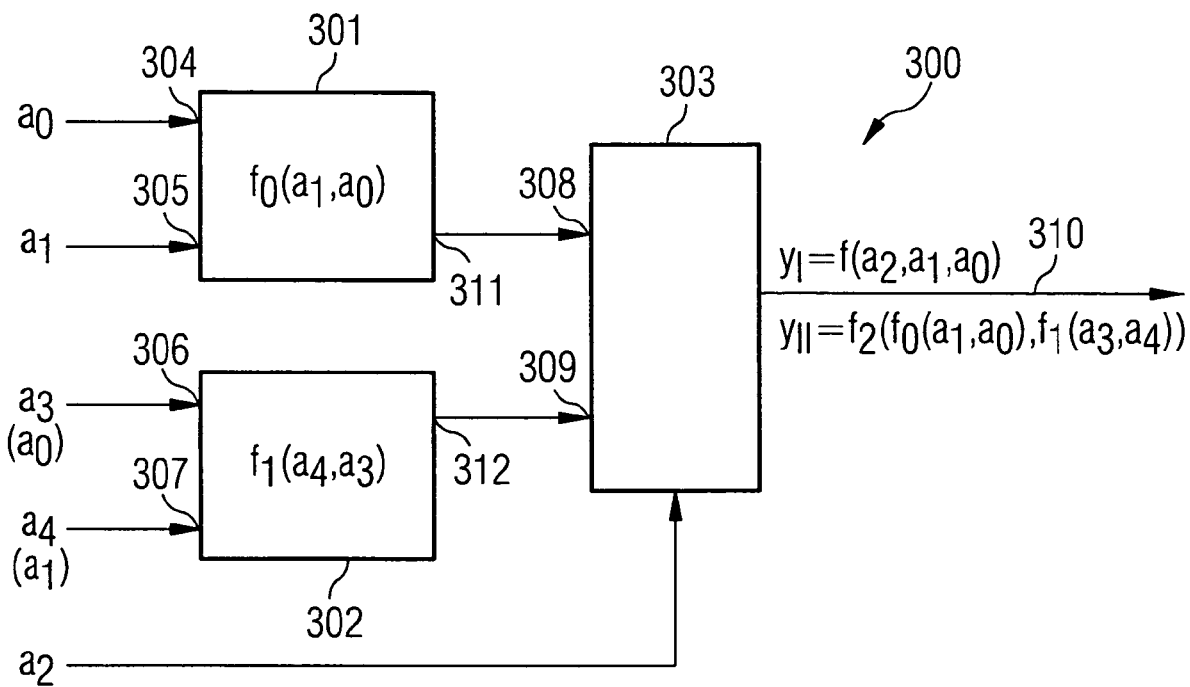
FIG. 3 shows a logic basic cell arrangement in accordance with an exemplary embodiment of the invention.

As an alternative to the configuration shown in FIG. 3, the first data signal $a_0$ may also be applied to the first data signal input 306 and the second data signal $a_1$ may also be applied to the second data signal input 307.

The logic basic cell arrangement 300, in the multiplex operating state of the logic basic cell 303, may constitute a circuitry realization of a Shannon decomposition of a function of three inputs.

If the case shown in FIG. 3 is generalized to the case of n+1 data signals $a_0, a_1 \ldots a_n$, then the mathematical operation effected by the logic basic cell (e.g. the logic basic cell 303) according to the invention in the multiplex operating state of the logic basic cell may be described by equation (4):

$$y(a_n, \ldots a_1, a_0) = \overline{a_n} \cdot y_0(a_{n-1}, \ldots, a_0) \lor a_n \cdot y_1(a_{n-1}, \ldots, a_0) \quad (4)$$

If the multiplexer is realized by the logic basic cell 303 according to the invention in the multiplex operating state, decompositions with the aid of any other functions of such an arrangement are also possible apart from the Shannon decomposition represented with reference to equation (4). If the logic basic cell 303 is operated in the logic function operating state, the functionality of the logic basic cell arrangement may also be described by equations (2), (3).

Particularly when the decomposition is disjoint, it is possible to achieve a considerable saving of logic resources in comparison with the Shannon decomposition. With the use of a logic basic cell 303 according to the invention, the decomposition is consequently chosen in a very flexible manner, the Shannon decomposition assuring the feasibility of a decomposition. Such an architecture constitutes a significant advance compared with conventional architectures such as are described for example in Wannemacher, U.S. Pat. No. 6,331,789 B. The result of the logic synthesis can thus in many cases be mapped onto a logic cell directly and without further adaptation.

Since, in an array of logic cells, $a_0, a_1, a_3, a_4$ may also perfectly well for their part be Boolean functions of two or more inputs, it may be expedient to use cells according to the invention in accordance with 303 for 301 and 302, in which case their control signals have to be allocated to the new inputs $a_5$ and $a_6$.

In order to additionally reduce the resources required for the logic basic cell 100 from FIG. 1, the multiplexers 128, 133, 138, 143 having a static multiplexer functionality may be replaced by a structure that is fixed after the creation of the circuit design. In other words, the logic basic cell of the invention may be realized as "structured ASIC" or "mask programmable gate array" (MPGA), in which case the multiplex devices may also be formed from invariable hardware components.

A description is given below, referring to FIGS. 4A, 4B, of two exemplary embodiments for multiplexers which are realized as invariable hardware elements.

Figure 4A:
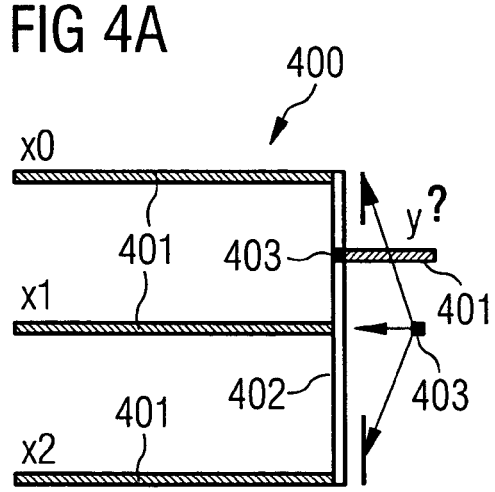
FIGS. 4A, 4B show schematic views of multiplexers that are realized by means of hardware elements predetermined in invariable fashion.

FIG. 4A shows a via-programmed multiplexer 400, in which interconnects are embodied in an n-th metallization plane 401, it being possible to provide signals x0, x1 and x2 on the interconnects. By means of a via 403 that can be provided in variable fashion, the n-th metallization plane 401 can be coupled to an (n–1)-th metallization plane 402, thereby realizing a static multiplexer functionality.

The metal-programmed multiplexer 410 shown in FIG. 4B once again shows interconnects in the n-th metallization plane 401 on which signals x0, x1 and x2 can be passed, it being possible for the desired multiplexer functionality to be set fixedly once by means of coupling only one of said interconnects to an output y with the aid of a short line portion in the metallization plane 401.

Figure 4B:
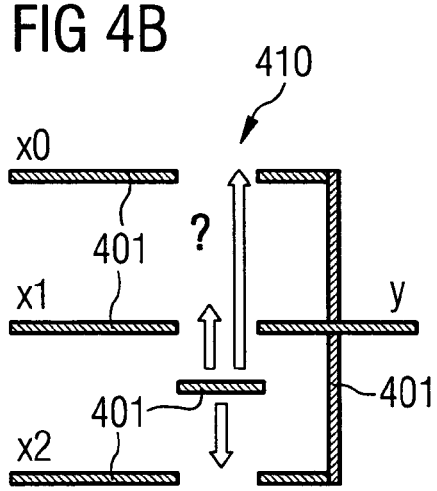

To put it another way, FIG. 4A and FIG. 4B show a via-programmed multiplexer 400 and a metal-programmed multiplexer 410. This realization makes it possible to form the four additional multiplexers shown in FIG. 1 without additional transistors and thus with reduced dimensioning.

A description is given below, with reference to FIG. 5, of a logic basic cell 500 in accordance with a second exemplary embodiment of the invention.

Figure 5:
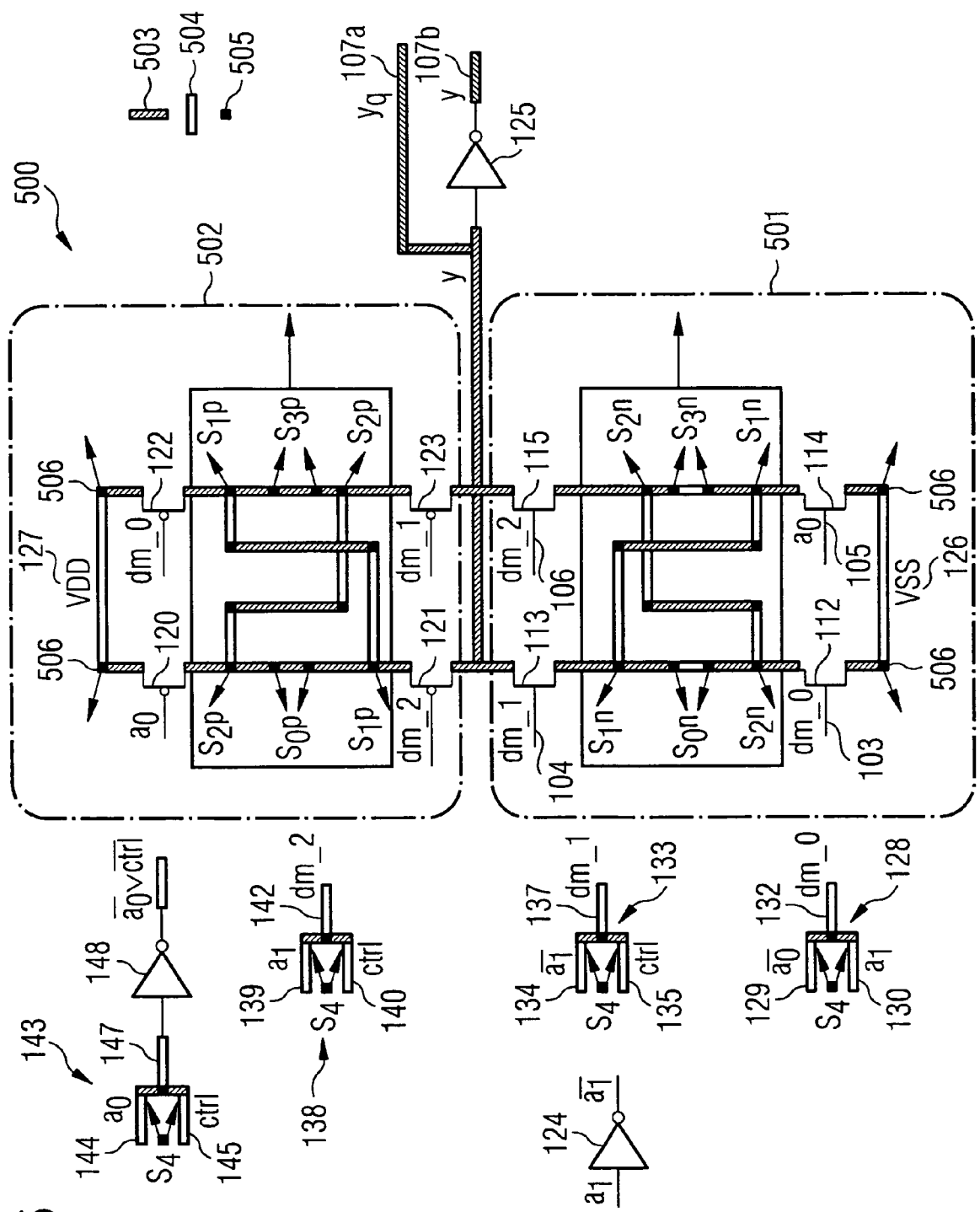
FIG. 5 shows a logic basic cell in accordance with a second exemplary embodiment of the invention.

The logic basic cell 500 from FIG. 5 differs from the logic basic cell 100 shown in FIG. 1 essentially by virtue of the fact that the logic selection transistors 108 to 111 and, respectively, the logic selection transistors 116 to 119 are replaced by hardwired contact-connecting elements, formed from components 503 to 505. The logic basic cell 500 is formed from a first data signal path 501, which contains first to fourth n-MOS data signal transistors 112 to 115 connected up in a manner similar to that in FIG. 1, and from a second data signal path 502, which contains p-MOS data signal transistors 120 to 123 connected up in a manner similar to that in FIG. 1. The interconnection of the data signal transistors 112 to 115, 120 to 123 in the two data signal paths 501, 502 is fixedly predetermined, that is to say realized by means of contact-connecting elements of a first metallization plane 503, of a second metallization plane 504 and using vias 505, which are formed in a manner running perpendicular to the paper plane of FIG. 5. To put it another way, the logic selection elements of the logic basic cell 500 are provided as invariable hardware elements, namely realized by means of a plurality of metallization planes 503, 504 and vias 505. The wiring of the data signal transistors 112 to 115 and 120 to 123 defines a respective fixedly predetermined logic function.

To put it another way, in FIG. 5 configuration transistors 108 to 111 and, respectively, 116 to 119 are replaced by via bridges and metallization components 503 to 505. Furthermore, four power vias 506 make it possible to isolate possibly omitted logic components from the supply voltage 127 $V_{DD}$ and from the ground potential $V_{SS}$ 126. The functionality table from FIG. 2 holds true for FIG. 5.

The switches between the individual transistors in FIG. 5 may be realized in any arbitrary manner using metal layers, polysilicon, diffusion regions or by means of any other suitable plane of a present-day or future CMOS process.

Within the standard CMOS circuitry, the logic basic cell 500 shown in FIG. 5 is a particularly small and fast logic basic cell that is particularly favorable in terms of the power consumption.

It should furthermore be noted that in FIG. 5 the multiplexers 133, 138, 143, 128 are also replaced by hardwired components of the metallization planes 503, 504 and vias 505.

Furthermore, it should be noted that the design of the multiplexer with an additional inverting output affords the advantage, in particular for the Shannon decomposition of parity functions, that only one additional multiplexer is required per additional variable to be XORed, whereas double the outlay would arise without the simultaneous presence of the preceding function and the logic inverse function.

A description is given below, with reference to FIG. 6, of a logic basic cell 600 in accordance with a third exemplary embodiment of the invention.

Figure 6:
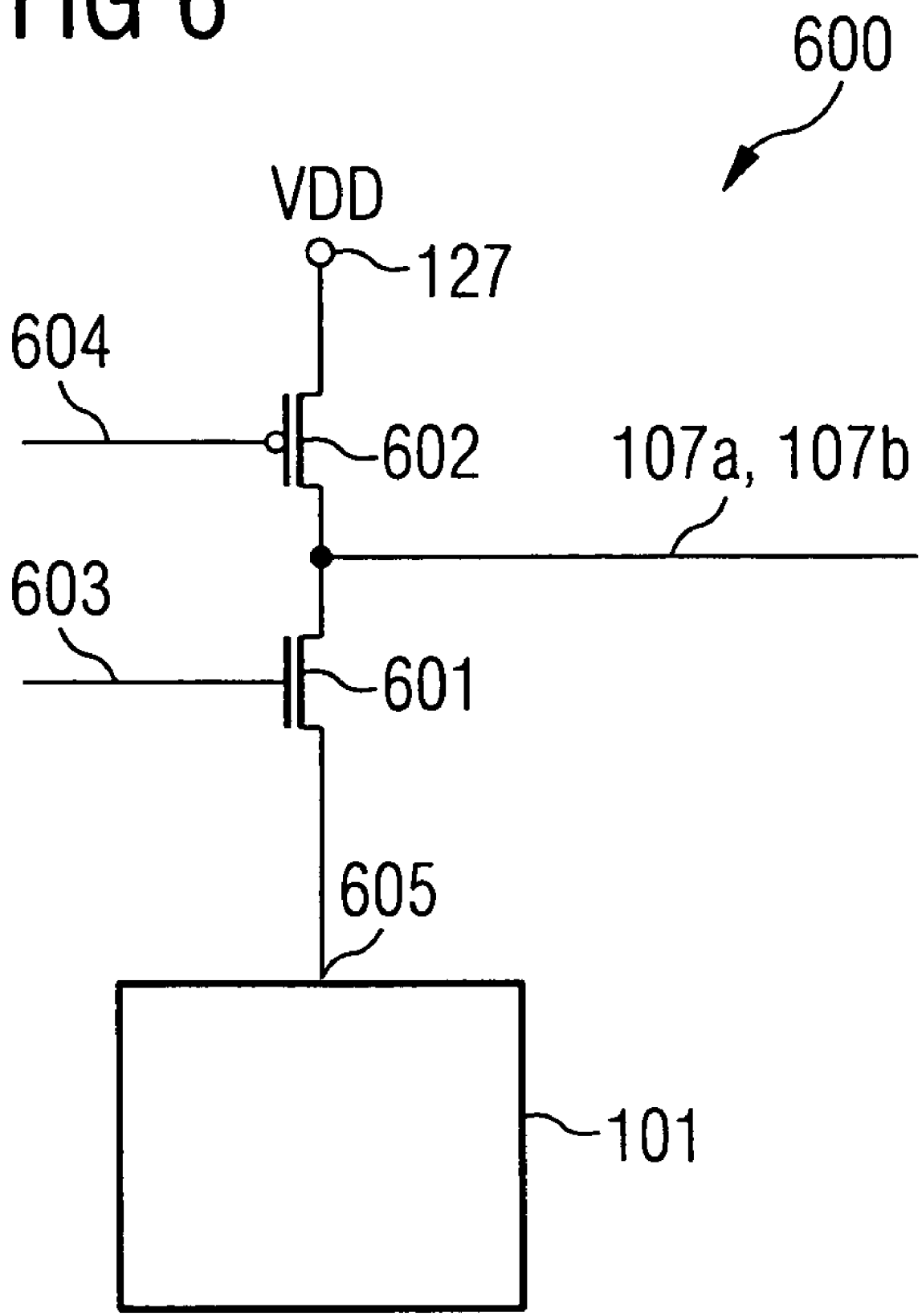
FIG. 6 shows a logic basic cell in accordance with a third exemplary embodiment of the invention.

In contrast to the logic basic cell 100 from FIG. 1, the logic basic cell 600 from FIG. 6 is constructed using non-static CMOS logic. The logic basic cell 600 is formed only from a data signal path 101, the internal interconnection of which corresponds to the interconnection of the transistors in the first data signal path 101 of FIG. 1. Consequently, in contrast to the logic basic cell 100, the logic basic cell 600 is provided with precisely one data signal path 101 comprising n-MOS field effect transistors 108 to 115, whereas the data signal path 102 comprising p-MOS field effect transistors 116 to 122 as shown in FIG. 1 is obviated in FIG. 6.

An output signal representing the result of the processing of the data signals $a_0, a_1, \ldots$ of the selected logic function is provided at a data signal path output 605 of the data signal path 101, which output is coupled to a first source/drain region of a p-MOS evaluation transistor 601. Given a corresponding signal at an evaluation input 603 coupled to the gate region of the evaluation transistor 601, the processed output signal is present at an output 107a or 107b of the logic basic cell 600, said output being coupled to the second source/drain region of the evaluation transistor 601. The second source/drain region of the evaluation transistor 601 is coupled to a first source/drain region of a p-MOS precharge transistor 602, the second source/drain region of which is brought to the electrical supply potential 127. Given a corresponding signal at a precharge input 604 coupled to the gate region of the precharge transistor 602, the electrical supply potential 127 is present as reference potential at the output 107a or 107b of the logic basic cell 600, said output being coupled to the first source/drain region of the precharge transistor 602.

Consequently, compared with FIG. 1, the path comprising p-MOS transistors is obviated in FIG. 6. The pull-down network 101 is formed from n-MOS transistors in FIG. 6 as in FIG. 1, whereas in FIG. 6 the pull-up network 102 comprising p-MOS transistors is obviated and replaced by a statically or dynamically switched precharge transistor 602. As an alternative to FIG. 6, the signal path comprising n-MOS transistors in FIG. 1 may also be obviated and replaced by a precharge transistor, in which case a signal path comprising p-MOS transistors is provided.

Consequently, in the case of the CMOS realization of the logic basic cell 600 according to the invention from FIG. 6, a precharge transistor 602 is provided, which brings the output 107a or 107b to a logic value "1" in a partial interval of the switching time of the logic basic cell 600 (precharge phase), whereas in the rest of the switching time the selected logic function is brought to the output 107a or 107b in the pull-down path 101 realized according to the invention (evaluation phase).

All circuits which contain at least one of the two paths (pull-up or pull-down path) of the structure of FIG. 1 likewise constitute a logic basic cell in the sense of the invention, irrespective of how the respective opposite logic potential is realized.

The logic basic cell 600 shown in FIG. 6 constitutes a particularly compact realization. The realization shown in FIG. 5 constitutes that realization with which the highest interference immunity can be achieved.

The invention claimed is:

1. A logic basic cell for processing a first and a second data signal, comprising:
   a multiplex device for multiplexing the first and second data signals in a multiplex operating state;
   a logic device for forming a logic combination of the first and second data signals in accordance with a selectable logic function in a logic function operating state,
   wherein an output signal is one of the first and second data signals during the multiplex operating state, and is the logic combination of the first and second data signals in accordance with the selected logic function during the logic function operating state; and
   a control unit, which predetermines, based on a control signal, whether the logic basic cell operates in the multiplex operating state or in the logic function operating state,
   and further comprising:
   first, second, third, and fourth data signal inputs, to which the first and second data signals and a logically complementary data signals thereof are applied;
   a first logic selection element connected between the first data signal input and the second data signal input;
   a second logic selection element connected between the first data signal input and the fourth data signal input;
   a third logic selection element connected between the second data signal input and the third data signal input; and
   a fourth logic selection element connected between the third data signal input and the fourth data signal input, wherein
   the first logic selection element is a first logic transistor, which can be controlled by means of a first logic selection signal;
   the second logic selection element is a second logic transistor, which can be controlled by means of a second logic selection signal;
   the third logic selection element is a third logic transistor, which can be controlled by means of a third logic selection signal; and
   the fourth logic selection element is a fourth logic transistor, which can be controlled by means of a fourth logic selection signal.

2. The logic basic cell as claimed in claim 1, further comprising first, second, third, and fourth data signal transistors, each comprising a gate terminal, at each of the gate terminals of which one of the first and second data signals or the complementary data signal with respect to one of the first and second data signals is provided.

3. The logic basic cell as claimed in claim 2, wherein the first data signal transistor is connected such that its
   first source/drain terminal is coupled to a first source/drain terminal of the first logic transistor and to a first source/drain terminal of the second logic transistor, and
   second source/drain terminal is coupled to a first source/drain terminal of the third data signal transistor.

4. The logic basic cell as claimed in claim 3, wherein the third data signal transistor is connected such that its second source/drain terminal is coupled to a first source/drain terminal of the fourth logic transistor and to a first source/drain terminal of the third logic transistor.

5. The logic basic cell as claimed in claim 2, wherein the second data signal transistor is connected such that its
   first source/drain terminal is coupled to a second source/drain terminal of the first logic transistor and to a second source/drain terminal of the third logic transistor, and
   second source/drain terminal is coupled to a first source/drain terminal of the fourth data signal transistor.

6. The logic basic cell as claimed in claim 5, wherein the fourth data signal transistor is connected such that its second source/drain terminal is coupled to a second source/drain terminal of the second logic transistor and to a second source/drain terminal of the fourth logic transistor.

7. The logic basic cell as claimed in claim 2, wherein
   each of the logic transistors and each of the data signal transistors is a transistor of a first conduction type, and the transistors of the first conduction type form a first data signal path, and
   a second data signal path is formed from transistors of a second conduction type, which is complementary to the first conduction type, in which case, for each of the transistors of the first data signal path, a correspondingly connected transistor is provided in the second data signal path.

8. The logic basic cell as claimed in claim 7, wherein
   the first conduction type is a p conduction type and the second conduction type is an n conduction type; or
   the first conduction type is an n conduction type and the second conduction type is a p conduction type.

* * * * *

UNITED STATES PATENT AND TRADEMARK OFFICE
CERTIFICATE OF CORRECTION

PATENT NO. : 7,425,842 B2
APPLICATION NO. : 11/131452
DATED : September 16, 2008
INVENTOR(S) : Jorg Gliese It is certified that error appears in the above-identified patent and that said Letters Patent is hereby corrected as shown below:

At column 2, line 18, "U.S. Pat. No. 6,331,789 B" should read --U.S. Pat. No. 6,331,789 B2--

At column 4, line 51, "$\wedge Q_1$" should read --$\wedge\ Q_1$--

At column 9, line 43, "a.sub.1" should read --$a_1$--

At column 9, line 47, "s.sub.4" should read --$s_4$--

At column 9, line 48, "$dm_{13}$ 1" should read --dm_1--

At column 9, line 53, "signal a," should read --signal $a_1$--

At column 9, line 66, "ctrl" should read --$\overline{ctrl}$--

At column 12, line 57, "U.S. Pat. No. 6,331,789 B" should read --U.S. Pat. No. 6,331,789 B2--

Signed and Sealed this

Ninth Day of December, 2008

JON W. DUDAS
*Director of the United States Patent and Trademark Office*